United States Patent
Oda et al.

(10) Patent No.: US 7,510,176 B2
(45) Date of Patent: Mar. 31, 2009

(54) SUBMOUNT ASSEMBLY AND METHOD OF PREPARING OPTICAL MODULE

(75) Inventors: Kenji Oda, Sakura (JP); Masato Takigahira, Sakura (JP); Kenichiro Asano, Sakura (JP)

(73) Assignee: FUJIKURA Ltd., Tokyo (JP)

( * ) Notice: Subject to any disclaimer, the term of this patent is extended or adjusted under 35 U.S.C. 154(b) by 0 days.

(21) Appl. No.: 11/954,274

(22) Filed: Dec. 12, 2007

(65) Prior Publication Data
US 2008/0095499 A1    Apr. 24, 2008

Related U.S. Application Data

(62) Division of application No. 10/940,993, filed on Sep. 15, 2004.

(30) Foreign Application Priority Data

Mar. 29, 2004    (JP)    ............... 2004-094253

(51) Int. Cl.
*B23Q 3/00*    (2006.01)
*H01L 23/58*    (2006.01)

(52) U.S. Cl. .............. 269/329; 269/903; 269/909; 257/48

(58) Field of Classification Search .............. 257/48; 269/329, 903, 909
See application file for complete search history.

(56) References Cited

U.S. PATENT DOCUMENTS

| | | | |
|---|---|---|---|
| 4,798,439 A * | 1/1989 | Preston | ............... 385/91 |
| 6,441,895 B1 * | 8/2002 | Kogan et al. | ............... 356/127 |
| 6,853,061 B2 | 2/2005 | Frutschy et al. | |
| 7,245,507 B2 | 7/2007 | DiBene, II et al. | |
| 2004/0170359 A1 * | 9/2004 | Velsher | ............... 385/49 |

OTHER PUBLICATIONS

L. Stauffer et al., "A surface-mounted device assembly technique for small optics based on laser reflow soldering", Optics and Lasers in Engineering 43 (2005), pp. 365-372.*
Naoki Kitamura, et al., Silica-Based Planar Lightwave Circuit for Passive Alignment of LD and Optical Fiber, 1997 Institute of Electronics, Information and Communication Engineers, Electronics Society Conference, p. 207, vol. C-3-98, Japan.
S. Sasaki, et al., Passive Alignment of LD Chip on PLC Platform Using Marker Method, 1996 Institute of Electronics, Information and Communication Engineers, Electronics Society Conference, p. 201, vol. C-201, Japan.
T. Hashimoto, et al., A Hybrid Integration of a Laser Diode and a Monitor Photodiode on a PLC Platform with the Passive Alignment Method, 1996 Institute of Electronics, Information and Communication Engineers General Conference, p. 206, vol. C-206, Japan.

* cited by examiner

*Primary Examiner*—Evan Pert
(74) *Attorney, Agent, or Firm*—Sughrue Mion, PLLC

(57) ABSTRACT

The present invention relates to a submount on which at least one optical component is mounted. The submount has a mounted portion that is mounted onto a substrate or base, and a protruding portion that protrudes out from the substrate or the base when the mounted portion is mounted to the substrate or base. The gripped portion is formed to enable gripping thereof. Wiring, to enable active alignment, is provided to the gripped portion, and active alignment can be carried out by powering up the optical component mounted on the submount.

6 Claims, 4 Drawing Sheets

SUBMOUNT ASSEMBLY AND METHOD OF PREPARING OPTICAL MODULE

BACKGROUND OF THE INVENTION

Priority is claimed to Japanese Patent Application No. 2004-94253 filed Mar. 29, 2004, the contents of which are incorporated herein by reference.

1. Field of the Invention

The present invention relates to a submount, optical module, and optical module manufacturing method by which the processes of temporary wiring, gripping and aligning when using active alignment to mount optical components such as laser diodes (LD) or photo diodes (PD) can be carried out with ease.

2. Description of Related Art

When mounting optical components like laser diodes (LD), photo diodes (PD), etc., to form an optical module such as an optical transmitting or optical receiving module, deviations of even a few micrometers can give rise to loss of the signal light. Accordingly, this process demands a highly accurate mounting technique. It has been established that marker mounting using the passive alignment method to mount optical components onto a PLC platform enables mounting with high positional accuracy and good reproducibility, and makes it possible to realize uniform optical coupling with the optical guided wave path (see, for example: Toshikazu Hashimoto, et al, A hybrid integration of a laser diode and a monitor photo diode on a PLC Platform with the passive alignment method, 1996 Institute of Electronics, Information and Communication Engineers General Conference C-206, P206; Seimi Sasaki et al, Passive alignment of LD chip on PLC platform using marker method, 1996 Institute of Electronics, Information and Communication Engineers Electronics Society Conference C-201, P201; Naoki Kitamura et al, Silica-based Planar Lightwave Circuit for passive alignment of LD and optical fiber, 1997 Institute of Electronics, Information and Communication Engineers, Electronics Society Conference C-3-98, P207).

In the aforementioned passive alignment mounting method, each part must be formed with a high degree of accuracy by, for example, forming a chip mounting bench or using etching to highly accurately carve a V-groove in a silicon substrate, etc., and then carrying out positioning using alignment marks. In order to carry out this passive alignment, extremely accurate component processing is required. However, despite the high cost that is required for this type of component processing, high accuracy often is not obtained, leading to a drop in output and sensitivity, and extremely poor yields.

The use of active alignment, which does not have the problems associated with component accuracy, may be considered in place of passive alignment. In active alignment, alignment is carried out by powering up the components in the device before fixing them in place. Therefore, it is necessary to provide wiring to the optical components. However, wire bonding or die bonding is used for the wiring for driving the optical components, and is therefore performed after the components have been fixed in place. Accordingly, active alignment in which alignment is performed by powering the optical components cannot be performed in this case.

BRIEF SUMMARY OF THE INVENTION

The present invention was conceived in view of the above-described circumstances, and has as its objective the provision of a submount, optical module and optical module manufacturing method by which active alignment can be employed.

The present invention provides a submount, on which an optical component is mounted, and a gripping mechanism that grips and engages the submount. The aforementioned submount can have a design in which wiring, to enable active alignment is provided, and the gripping mechanism can have at least one electrode that contacts the wiring of the submount when the submount is gripped or engaged by the gripping mechanism.

According to one exemplary embodiment of the present invention, the submount can comprise a mounted portion that is mounted onto a substrate or base, and a protruding part that protrudes out from the substrate or the base when the mounted portion is mounted to the substrate or base, the protruding portion being formed to enable gripping thereof.

According to another exemplary embodiment, the submount can comprise a clearance side that faces a clearance between the submount and the substrate or base when the submount is mounted thereto, and an opposite side that is roughly opposite to the clearance side, the clearance side and the opposite side being formed to enable gripping thereof.

According to another exemplary embodiment, the submount can comprise a submount main body and at least one grippable projection that is provided to a side, rear or top surface of the submount main body.

According to a further exemplary embodiment, the submount can comprise a submount main body, and the wiring to enable active alignment can be provided to the side surface of the submount main body.

According to still another exemplary embodiment, the submount can have a submount main body in which at least one hole is formed, and the gripping mechanism can have at least one projection that inserts into the at least one hole and enables gripping of the submount.

According to this embodiment, the wiring to enable active alignment is connected to the at least one hole.

The present invention also provides an optical module wherein any one of the above-described submounts according to the present invention is mounted onto a substrate or base.

The present invention further provides an optical module manufacturing method, comprising mounting an optical component on a submount, the submount having wiring electrically linked to the optical component, gripping the submount with a gripping mechanism having an electrode, such that the electrode contacts the wiring of the submount; providing power to the optical component through the electrode and wiring; aligning the optical component and submount, and fixing the submount in place on a base.

The present invention enables alignment to be carried out using active alignment, making it possible to form a high performance optical module even when using inexpensive components.

By using active alignment, it is possible to form a high performance optical module with surety, and thus increase yield.

BRIEF DESCRIPTION OF THE DRAWINGS

These and other features, aspects, and advantages of the present invention will become better understood with reference to the following description and accompanying drawings, which should not be read to limit the invention in any way, in which.

DETAILED DESCRIPTION OF THE INVENTION

Preferred embodiments of the present invention will now be explained with reference to the figures.

Figure 1A:
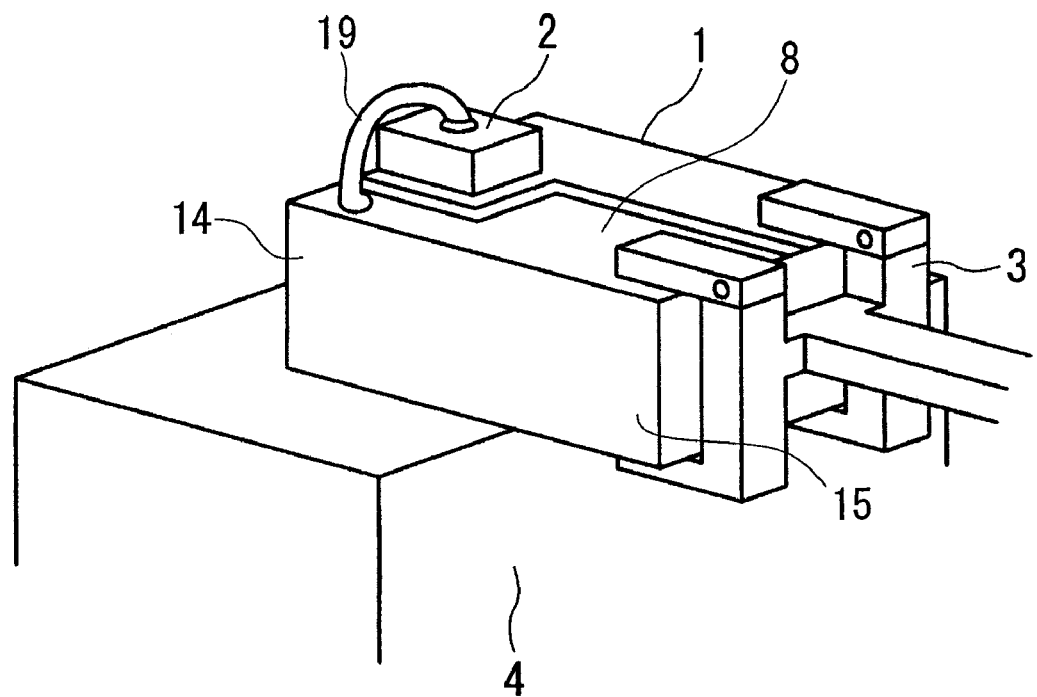
FIG. 1A is a perspective view of a first exemplary embodiment of the submount and optical module of the present invention.
Figure 1B:
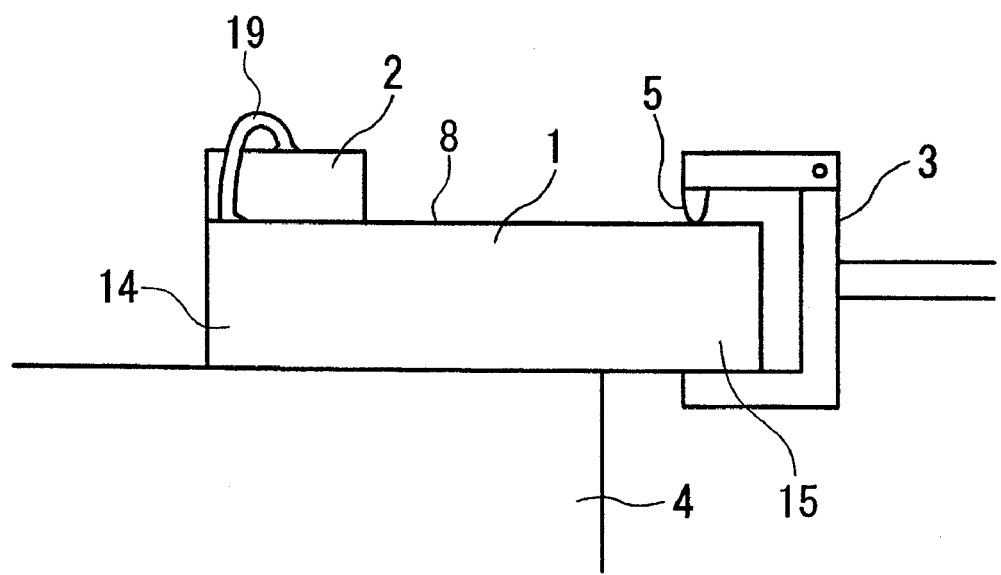
FIG. 1B is a side view of the submount and optical module of FIG. 1A.

FIGS. 1A and 1B show a first exemplary embodiment of a submount and optical module of the present invention. FIG. 1A is a perspective view of the optical module, and FIG. 1B is a side view. In FIGS. 1A and 1B, numeric symbol 1 is the submount; 2 is an optical component such as a laser diode (LD) or photo diode (PD); 3 is a clamp for gripping submount 1; 4 is a substrate; and 5 is an electrode that is provided to an end of clamp 3.

In this embodiment, submount 1 on which optical component 2 is mounted is characterized in that part of submount 1 is formed to protrude out from substrate 4 when mounted thereto. This protruding part is formed to enable gripping by the clamp 3. In other words, the submount 1 is provided with a mounted portion 14 that is mounted on the substrate 4, and a protruding part 15 that protrudes out from the substrate 4 and can be gripped when the mounted portion 14 is mounted on the substrate 4.

According to this embodiment, the optical module has a design in which the submount 1 is mounted on the substrate 4, as shown.

Further, according to this embodiment, the submount 1 includes wiring 8, provided to the protruding part, to enable active alignment. In other words, one end of this wiring 8 is connected to the optical component 2 via the electric connecting member 19, and the other end extends to the protruding part 15. An electrode 5 is provided to the clamp 3, and supplies the electrical power for driving the optical component 2. When the protruding part is gripped by the clamp 3, the electrode 5 and the optical component 2 are connected by wiring 8, making it possible to power up the optical component 2.

Next, a method for manufacturing an optical module according to the present embodiment will be explained. First, the optical component 2 having been mounted on the submount, the protruding part 15 of submount 1 is gripped with the clamp 3, and is mounted onto the substrate 4. The wiring of the optical component 2 is temporarily connected to the wiring 8 that is formed on the top surface of the submount 1.

Next, electrical power for powering up the optical component 2 is supplied via an electrode 5 of the clamp 3, and the optical component 2 is powered up and further aligned using active alignment. Once the submount 1 is correctly positioned by active alignment, the submount 1 is fixed in place on the substrate 4, and the clamp 3, which grips the submount 1, is released. Next, permanent wiring is carried out by wire bonding, etc. in order to form the optical module.

The present embodiment enables alignment to be performed by active alignment, thus making it possible to form a high-performance optical module, even when using inexpensive parts.

Further, by carrying out alignment using active alignment, it is possible to form a high-performance optical module with certainty, thus increasing yield.

Figure 2:
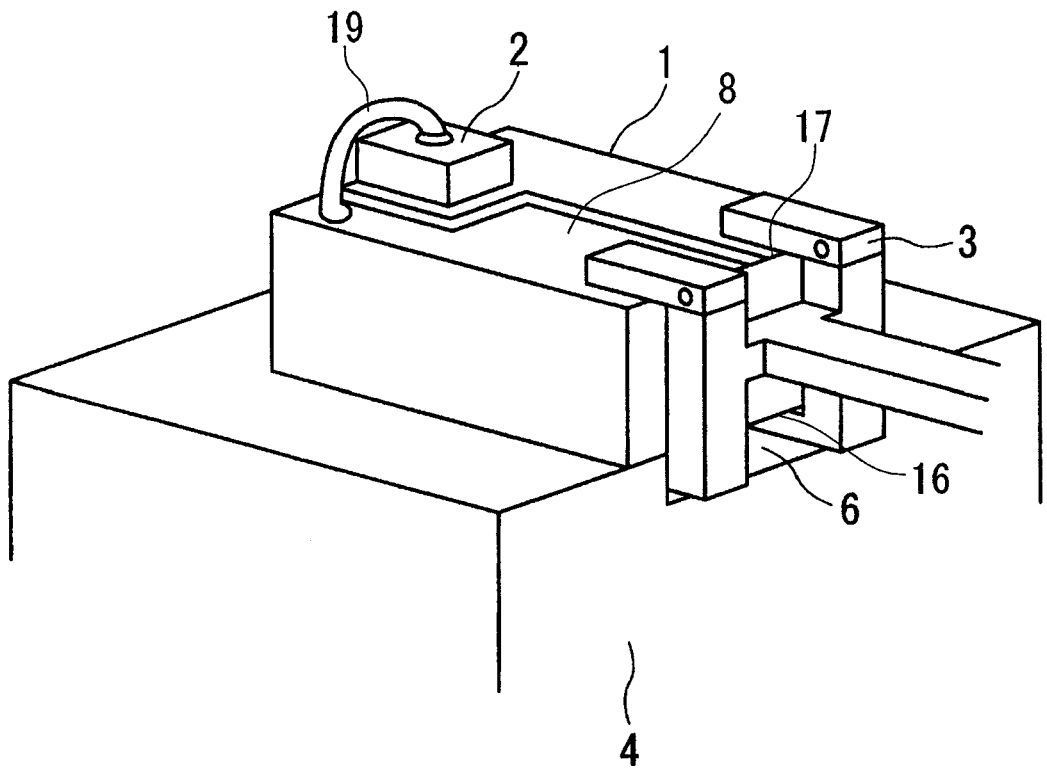
FIG. 2 is a perspective view showing a second exemplary embodiment of the submount and optical module of the present invention.

FIG. 2 is a perspective view showing a second exemplary embodiment of a submount and optical module of the present invention. Composition elements of the submount and optical module that are equivalent to those of the first embodiment have been indicated with the same numeric symbol. The submount of this embodiment is designed such that, when the submount 1 is mounted on the substrate 4, a clearance 6 is formed as a space between the submount 1 and the substrate 4, and the submount 1 can be gripped by the clamp 3 on the side facing the clearance 6 and on the side opposite the clearance 6. In other words, in this second embodiment, the submount 1 is provided with a clearance side 16, that faces the clearance 6 between the submount 1 and the substrate 4 when the submount 1 is mounted thereon, and an opposite side 17, opposite to the clearance side 16. The clearance side 16 and the opposite side 17 are formed to enable gripping thereof.

The optical module according to this embodiment is designed such that the submount 1 is mounted on the substrate 4.

According to this embodiment, wiring 8, to enable active alignment is provided to the opposite side 17, i.e., the top surface of submount 1 in FIG. 2. In other words, one end of wiring 8 is connected to the optical component 2 via the electric connecting member 19 and the other end extends to the protruding portion that is gripped by the clamp 3. An electrode 5 for supplying electrical power for driving optical component 2 is provided to the clamp 3. When the clearance side 16 and the opposite side 17 are gripped by the clamp 3, the electrode 5 and the optical component 2 are connected via wiring 8, thereby making it possible to power up the optical component 2.

As in the case of the optical module according to the first embodiment described above, the optical module of this embodiment can be manufactured by gripping the submount 1 with a clamp, mounting it onto the substrate 4, and aligning via active alignment by powering up the optical component 2. Thereafter, the submount 1 is fixed in place to the substrate 4, the clamp 3 is released, and permanent wiring of optical component 2 is performed.

The optical module of this embodiment provides the same effects as that of the first embodiment.

Figure 3:
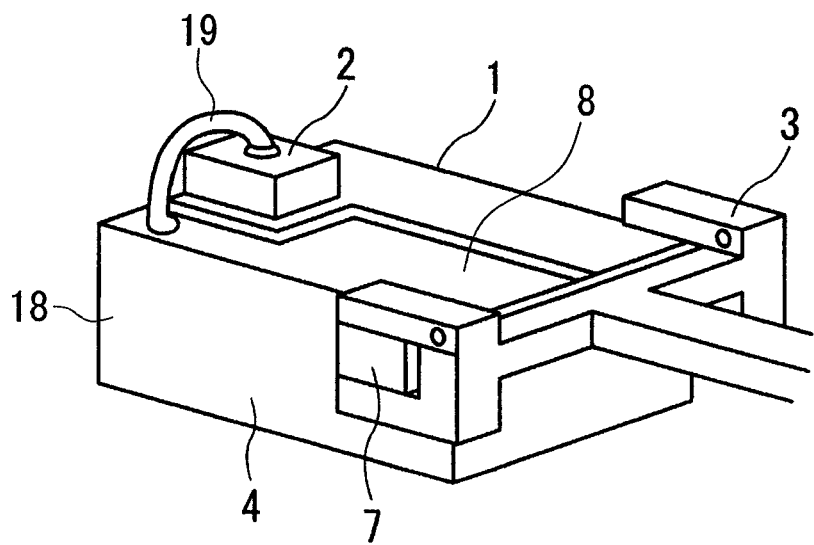
FIG. 3 is a perspective view showing a third exemplary embodiment of the submount and optical module of the present invention.

FIG. 3 is a perspective view showing a third exemplary embodiment of an optical module and submount of the present invention. Composition elements of the submount and optical module that are equivalent to those of the first embodiment have been indicated by the same numeric symbol. The submount of this embodiment is designed so that projections 7 for gripping the submount 1 are provided to the side surfaces of the submount, and these projections 7 can be gripped by the clamp 3. In other words, in this third embodiment, the submount 1 is provided with a submount main body 18, and grippable projections 7 that are provided to the side surfaces of the submount main body 18.

The optical module according to the present embodiment is designed such that the submount 1 is mounted on the substrate 4.

According to this embodiment, wiring 8 is provided on the surface of projections 7, in order to enable active alignment. In other words, one end of the wiring 8 is connected to the optical component 2 via the electric connecting member 19, and the other end extends to the portions of the projections 7 which are gripped by the clamp 3. An electrode 5, for supplying electrical power for driving the optical component 2, is provided to the clamp 3 which grips the projections 7. When the projections 7 are gripped by this clamp 3, the electrode 5 and the optical component 2 are connected by wiring 8, enabling powering up of the optical component 2.

As in the case of the optical module according to the first embodiment described above, the optical module of this embodiment can be manufactured by gripping the submount 1 with the clamp, mounting it onto the substrate 4, and aligning it via active alignment by powering up the optical component 2. Thereafter, the submount 1 is fixed in place to the substrate 4, the clamp 3 is released, and permanent wiring of the optical component 2 is performed.

The optical module of this embodiment provides the same effects as that of the first embodiment.

Figure 4:
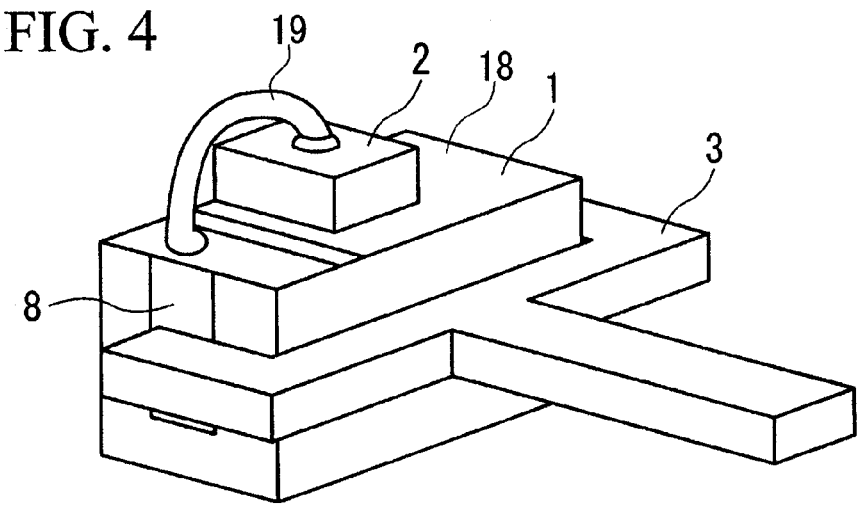
FIG. 4 is a perspective view showing a fourth exemplary embodiment of the submount and optical module of the present invention.

FIG. 4 is a perspective view showing a fourth exemplary embodiment of an optical module and submount of the present invention. Compositional elements of the submount and optical module that are equivalent to those of the optical module and submount in the first embodiment have been indicated by the same numeric symbols. The submount 1 of this embodiment is designed so that wiring 8 is provided to a side surface thereof, in order to enable active alignment. This wiring 8 is connected to the optical component 2 via the electric connecting member 19. An electrode 5, for supplying electrical power for driving the optical component 2, is provided to the clamp 3 which grips the submount 1. When the side surfaces of the submount 1 are gripped by this clamp 3, the electrode 5 and the optical component 2 are connected via the wiring 8, enabling powering up of the optical component 2. In other words, in this fourth embodiment, the submount 1 is provided with a submount main body 18 and wiring 8 on a side surface of the submount main body 18, for enabling active alignment.

As in the case of the optical module according to the first embodiment described above, the optical module of this embodiment can be produced by gripping submount 1 with a clamp, mounting it on the substrate 4, and aligning it via active alignment by powering up the optical component 2. Thereafter, the submount 1 is fixed in place to the substrate 4, the clamp 3 is released, and permanent wiring of the optical component 2 is performed.

The optical module of this embodiment provides the same effects as that of the first embodiment.

Figure 5A:
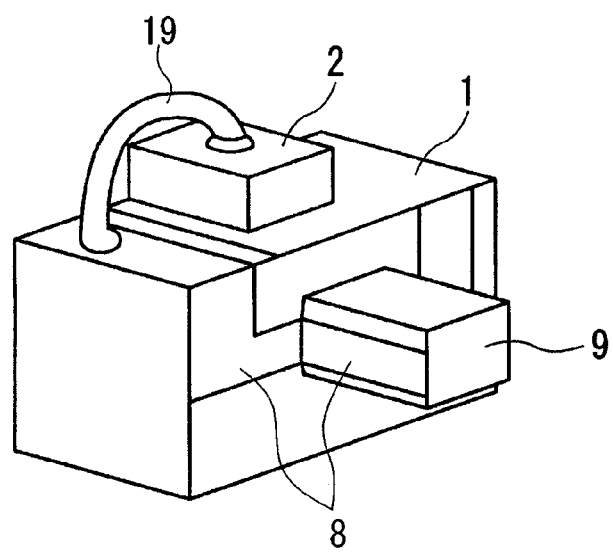
FIG. 5A is a perspective view of a fifth exemplary embodiment of the submount and optical module of the present invention where a gripped portion is formed to the side surface of the submount.
Figure 5B:
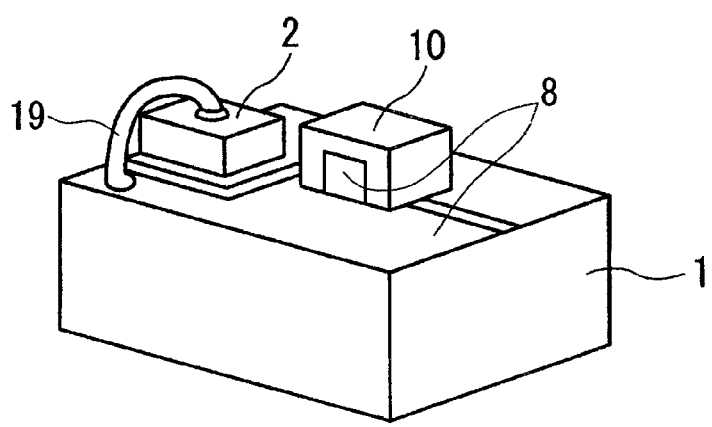
FIG. 5B is a perspective view of the submount and optical module of FIG. 5A where a gripped portion is formed to the top surface of the submount.

FIGS. 5A and 5B are perspective views showing a fifth exemplary embodiment of an optical module and submount of the present invention. Compositional elements that are equivalent to those of the optical module and submount in the first embodiment have been indicated with the same numeric symbol. The submount 1 of this embodiment is designed so that, as shown in FIG. 5A, a portion 9 for gripping is formed projecting out from the rear surface of the submount 1, or, as shown in FIG. 5B, a portion 10 for gripping is formed projecting out from the top surface of the submount 1. These gripped portions 9 and 10 can be gripped by the clamp 3.

Further, the optical module of this embodiment has a design wherein the submount 1 is mounted onto the substrate 4.

In this embodiment, the surface of the gripped portions 9 and 10 are provided with wiring 8 in order to enable active alignment. In other words, one end of the wiring 8 is connected to the optical component 2 via the electric connecting member 19 and the other end extends to the gripped portions 9 and 10. An electrode 5 for supplying electrical power for driving the optical component 2 is provided to the clamp 3 which grips the gripped parts 9 and 10. When the gripped parts 9 and 10 are gripped by this clamp 3, the electrode 5 and the optical component 2 are connected by the wiring 8, enabling powering up of the optical component 2.

As in the case of the optical module according to the first embodiment described above, the optical module of this embodiment can be manufactured by gripping the submount 1 with a clamp, mounting it on the substrate 4, and aligning it via active alignment by powering up optical component 2. Thereafter, the submount 1 is fixed in place to the substrate 4, the clamp 3 is released, and permanent wiring of the optical component 2 is performed.

The optical module of this embodiment provides the same effects as those of the first embodiment.

Figure 6:
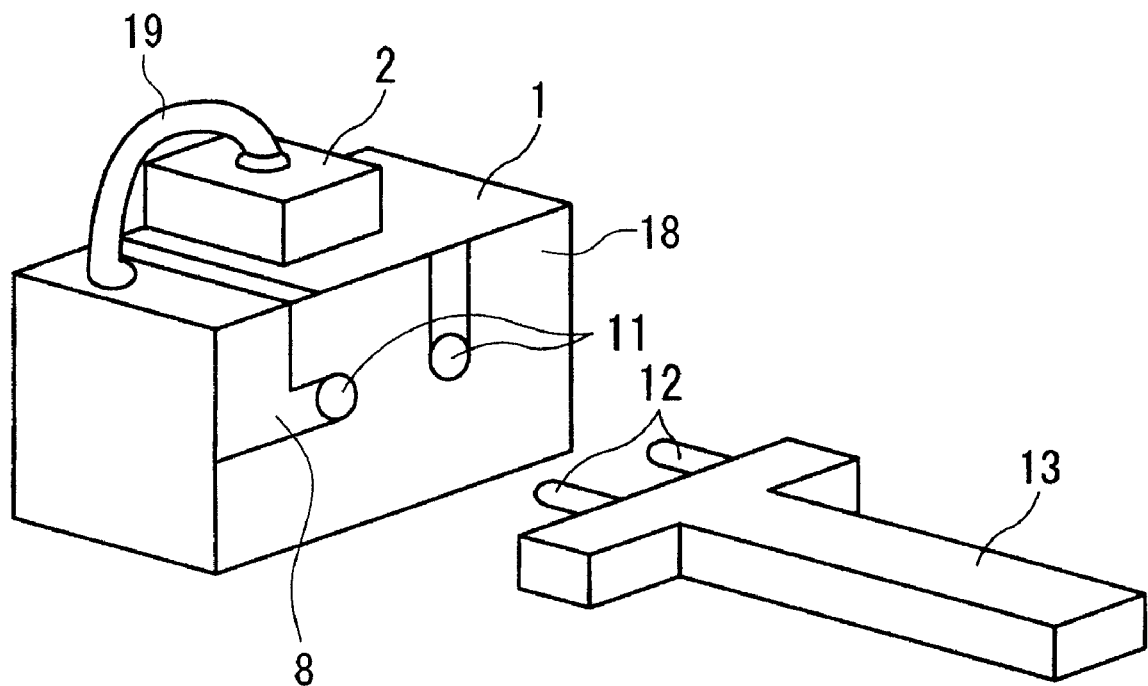
FIG. 6 is a perspective view showing a sixth exemplary embodiment of the submount and optical module of the present invention.

FIG. 6 is a perspective view showing a sixth exemplary embodiment of an optical module and submount according to the present invention. Compositional elements that are equivalent to those of the optical module and submount in the first embodiment have been indicated with the same numeric symbol. The submount 1 of this embodiment is designed so that one or more holes 11 are provided to any one of the side, front, rear, or top surfaces, and projections 12 of a connecting member 13 are inserted into the holes 11, enabling gripping of the submount. In other words, in this sixth embodiment, the submount 1 is provided with a submount main body 18 in which at least one hole 11 is formed, and a connecting member 13 that has projections 12 for inserting into the holes 11, enabling gripping of the submount 1.

The optical module of this embodiment has a design in which the submount 1 is mounted on the substrate 4.

According to this embodiment, the holes 11 are connected to wiring 8 in order to enable active alignment. In other words, one end of wiring 8 is connected to the optical component 2 via the electric connecting member 19 and the other end extends to the inner surface of the holes 11. The connecting member 13, having projections 12, is designed to supply electrical power for driving the optical component 2 via the projections 12. The projections 12 of the connecting member 13 are inserted into the holes 11 and, when the submount 1 is gripped, the projections 12 on the connecting member 13 and the optical component 2 are connected via wiring 8, enabling powering up of the optical component 2.

The optical module of this embodiment can be manufactured by gripping the submount 1 by inserting the projections 12 of the connecting member 13 into the holes 11 of the submount 1, mounting the submount 1 on the substrate 4, performing active alignment by powering up the optical component 2, and, thereafter, fixing submount 1 in place on substrate 4.

The optical module of this embodiment provides the same effects as those of the first embodiment.

What is claimed is:
1. A submount assembly comprising:
a submount on which an optical component is mounted; and
a gripping mechanism which engages the submount, wherein:

the submount comprises wiring electrically linked to the optical component; and the gripping mechanism comprises at least one electrode, such that when the submount is engaged by the gripping mechanism, the at least one electrode contacts the wiring.

2. The submount assembly according to claim 1, wherein:

the submount further comprises at least one projection; and the gripping mechanism is a clamp which grips the at least one projection.

3. The submount assembly according to claim 2, wherein the at least one projection is a single projection protruding from a rear surface of the submount.

4. The submount assembly according to claim 2, wherein the at least one projection is a single projection protruding from a top surface of the submount.

5. A submount assembly comprising:

a submount on which an optical component is mounted; and a gripping mechanism which engages the submount, wherein:

the submount has at least one hole in a side thereof; and the gripping mechanism comprises at least one prong which is inserted into the at least one hole of the submount.

6. A submount assembly comprising:

a submount on which an optical component is mounted; and a gripping mechanism which engages the submount, wherein:

the submount comprises wiring electrically linked to the optical component; and the gripping mechanism comprises at least one electrode, such that when the submount is engaged by the gripping mechanism, the at least one electrode contacts the wiring, wherein:

the submount has at least one hole in a side thereof, into which the wiring extends;

the gripping mechanism further comprises at least one prong which is inserted into the at least one hole of the submount; and the at least one electrode is disposed on the at least one prong, such that when the at least one prong is inserted into the at least one hole in the submount, the electrode contacts with the wiring of the submount.

* * * * *